United States Patent [19]

Gow, 3rd et al.

[11] Patent Number: 5,168,368

[45] Date of Patent: Dec. 1, 1992

[54] LEAD FRAME-CHIP PACKAGE WITH IMPROVED CONFIGURATION

[75] Inventors: John Gow, 3rd, Milton; Richard W. Noth, Fairfax, both of Vt.

[73] Assignee: International Business Machines Corporation, Armonk, N.Y.

[21] Appl. No.: 697,827

[22] Filed: May 9, 1991

[51] Int. Cl.⁵ .................... H01L 21/60; H01L 23/48
[52] U.S. Cl. .................... 257/666; 257/668; 257/670; 257/784
[58] Field of Search ................ 357/70, 68, 72

[56] References Cited

U.S. PATENT DOCUMENTS 4,754,317 6/1988 Comstock et al. ............ 357/70
4,989,069 1/1991 Hawkins ...................... 357/70

FOREIGN PATENT DOCUMENTS

| | | |
|---|---|---|
| 0078606 | 5/1983 | European Pat. Off. |
| 60-92646 | 5/1985 | Japan . |
| 60-176245 | 9/1985 | Japan . |
| 61-82439 | 4/1986 | Japan . |
| 61-237459 | 10/1986 | Japan . |
| 62-2628 | 1/1987 | Japan . |
| 62-94967 | 5/1987 | Japan . |
| 63-92047 | 4/1988 | Japan . |
| 1-312866 | 12/1989 | Japan . |

Primary Examiner—Eugene R. LaRoche
Assistant Examiner—Viet Q. Nguyen
Attorney, Agent, or Firm—Calfee, Halter & Griswold

[57] ABSTRACT

An improved package for semiconductor chips, and method of forming the package are provided. The package includes a lead frame having a central chip bonding portion and first and second sets of interdigitaled fingers. The inner ends of the first set of fingers terminate at a distance from the central chip bonding portion closer than the inner ends of the fingers of the second set at fingers. A semiconductor chip, having input/output pads is bonded to the central chip bonding portion. A first set of wires directly couples respective input-/output pads on the chip to the first set of fingers. A second set of wires couples respective input/output pads on the chip with the second set of fingers. Each of the wires of the second set of wires has a first segment extending from its respective input/output pad to an intermediate bonding region, and a second segment extending from the intermediate bonding region to its respective finger of the second set of fingers.

9 Claims, 2 Drawing Sheets

LEAD FRAME-CHIP PACKAGE WITH IMPROVED CONFIGURATION

TECHNICAL FIELD

This invention relates generally to packaging of semiconductor chips, and more particularly to packaging of semiconductor chips utilizing a lead frame wherein the semiconductor chip is encapsulated together with a portion of the lead frame, and the lead frame provides electrical connections with the circuitry on the chip.

BACKGROUND OF THE INVENTION

Background Art

Current packaging techniques for semiconductor chips include various types of lead frame packaging. In such lead frame types of packaging a sheet of conductive material such as copper is provided which is punched or etched or otherwise formed to a configuration wherein a plurality of fingers are provided which are attachable to pads formed on a semiconductor chip. The limitation of how closely the fingers can be spaced for both etching and punching techniques is a function of the thickness of the lead frame material. There are practical limitations to how thin this stock can be, established by the fragility and planarity requirements needed to attach the finished module to the panel (card or board) in subsequent assembly processes. This dictates that the lead frame thickness be generally in the range of 4 to 10 mils, depending on the metal selection of this lead frame. The chip pads provide for the input/output, ground and voltage leads to the circuitry on the chip. In one form of lead frame packaging the fingers are directly attached to the contact pads on the chip. However, as the size of semiconductor chips decreases while the same amount of circuitry is maintained or even increased, thus maintaining or even increasing the number of I/O pads, the physical size of the fingers which would be required to provide the necessary signals and other physical characteristics including the required spacing between the fingers is such that it is not possible to directly attach to the chip to all the fingers that are required for the various input/output, voltage and ground connections on the chip.

One technique for overcoming the size limitations of the fingers is to form the lead frame in such a way that the fingers terminate a substantial distance from each edge of the chip thus providing a large enough geometry of the inner periphery of the lead frame, which surrounds the chip, to allow for the formation of the required number of fingers to connect with the input/output, voltage and ground pads. The input/output pads of the chip are then joined to the fingers by means of lead wires which are electrically interconnected between the pads on the chip and the fingers such as by soldering or other electrical bonding means. This type of connection is reasonably adequate over relatively short distances (i.e., up to about 100 mils or so). However, over longer distances (e.g., distances approaching 200 mils) this type of connection has several disadvantages.

One particular disadvantage is encountered during subsequent encapsulation processes wherein the chip, the lead frame, and connector wires are molded into a plastic encapsulant to form a final structure. During this molding or encapsulating operation, the plastic, which is viscus, is caused to flow around the chip and the lead frame and connecting wires. One of the phenomena that takes place during this molding or encapsulating is what is known as "wire sweep" or "wire wash". This is characterized by a force generated by the relatively viscous encapsulant flowing against the wires, which force can cause wires to break their connections with either the chip or the fingers or in some cases can cause the wires to either short against each other or come into such close proximity so as to cause unwanted capacitance and other problems.

Another drawback to the connection of lead wires to the fingers and the chip is the increased inductance caused by the length of the wires necessary to form the connection.

In addition to these drawbacks, there is an additional limitation to conventional lead frame bonding. This drawback is characterized by the requirement that each finger be aligned with the specific connection pad on the chip to which it is to be connected. Expressed another way, this limitation dictates that the pads on the chip must be connected to the fingers on the lead frame in the same order that they are positioned on the chip; i.e., there can be no cross-over connections of the fingers to pads which are not directly aligned with them.

There have been several prior proposals for improving the connection of a chip to the fingers of a lead frame by means of connecting wires. Two such proposals are shown in Japanese Kokai 62-94967 to NEC Corporation and Japanese Kokai 61-237459 to Sumatomo Electric Ind. Ltd. Both of these references show a chip connected to the fingers of a lead frame in which insulating films are interposed between the chip and the fingers and the wires are bonded from the pads on the chip to the conducting pads on the insulating films and then in a second step from the conducting pads on the insulating film to the fingers. Japanese Kokai 61-82439 to Toshiba Corporation shows a similar structure but in this structure rather than the two wires being electrically bonded to an intermediate section a single wire is looped and connected physically by an adhesive to an intermediate section and then carried on to the finger.

European Patent Application 0078606 to Texas Instruments shows a technique of bonding chip pads to lead frame fingers wherein a single wire is connected both to the chip pads and the finger and is supported intermediate its ends by an insulating support.

All four of these references do address the problems of "wire sweep" or "wire wash" in that the unsupported lengths of the wires are reduced as opposed to in a single loop running from the pads on the chip to the fingers. However, none of these references address the problem of the increased inductance caused by the long wire lengths. Moreover, none of these references teach or allow for cross-over, and all require the connection of a specific finger with the aligned pad on the chip.

SUMMARY OF THE INVENTION

According to the present invention, an improved encapsulated semiconductor chip and lead frame package and method of forming the package is provided. The semiconductor chip has a plurality input and output pads thereon. The lead frame has first and second sets of interdigitated extended fingers with each set having inner and outer ends surrounding the chip. The first set of fingers has its inner ends terminating at a first distance from the chip and the second set of fingers has the inner ends thereof terminating at a second distance from the chip with the second distance being greater than the first distance. A first set of wires directly couples respective pads on the chip to the inner ends of the respective ones of the fingers of the first set of fingers. A second set of wires couples respective pads on the chip with the second fingers, the wires of each of said second set of wires having a first portion extending from the respective pad to an intermediate bonding region and a second portion extending from the intermediate bonding region to one of the fingers on the second set. Plastic encapsulating means envelopes the chip and inner ends of said fingers and the wires.

This configuration allows one set of fingers to be placed in close proximity to the chip and a second set of fingers to be spaced further from the chip with the first set of fingers being directly bonded to the pads of the chip. The distance that the first set of wires extends is small enough that "wire wash" or "wire sweep" is not a concern whereas the second set of fingers which are more distantly spaced from the chip are connected with wires and which have two sections and which are bonded intermediate to their ends to thereby overcome the problem of "wire sweep" or "wire wash". Because some of the fingers are closer there is a reduction in the inductance caused by the wires compared to prior art where all of the fingers were a long distance from the chip. Also, because of the intermediate connections cross-overs can be effected; i.e. fingers can be connected to the pads which are not directly across from them by virtue of the configuration of intermediate bonding utilizing sets of fingers of two different lengths.

DESCRIPTION OF THE PREFERRED EMBODIMENT

Figure 1:
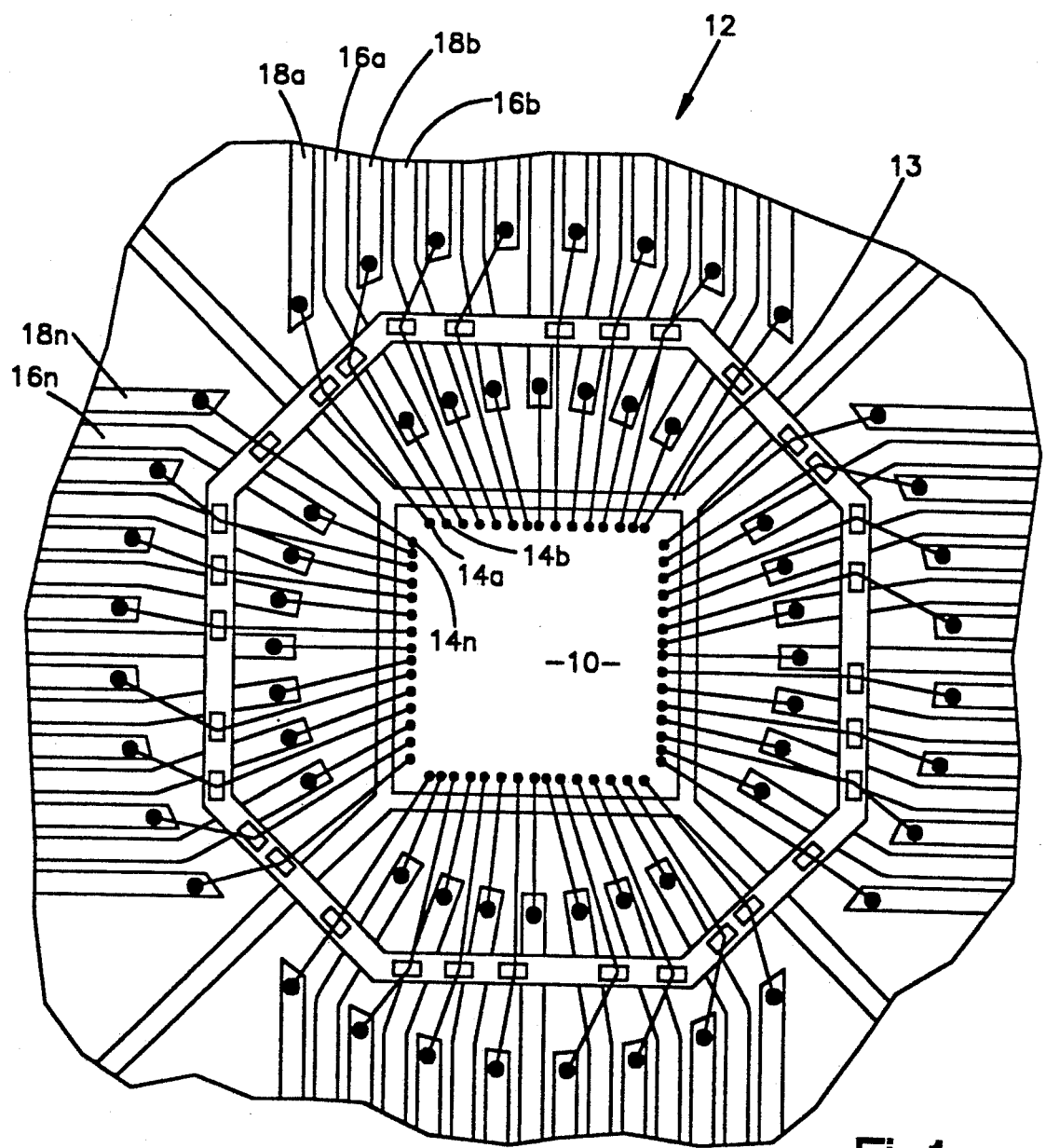
FIG. 1 is a top plan view somewhat schematic showing a semiconductor chip mounted to a lead frame according to this invention.

Referring now to the drawings, a semiconductor chip 10 is shown mounted on a lead frame 12 according to the present invention. The chip 10 has a series of contact pads 14a, 14b ... 14n peripherally spaced there around which contact pads connect with circuitry (not shown) on the chip. The necessary I/O signals as well as ground plane connections and power plane connections must be made to the contact pads on the chip to provide the necessary I/O signals and operating voltages for the chip performance function either as a logic or a memory chip. The necessary I/O signals and voltage and ground levels are provided from the lead frame 12 having various contact fingers which will be described presently. The lead frame 12 has a flag or chip bond pad portion 13 on which the chip 10 is mounted, a first set of fingers 16a, 16b ... 16n and a second set of fingers 18a, 18b ... 18n. The two sets of fingers 16 and 18 are coplanar and interdigitated, with the fingers of the set 16 extending beyond the ends of the fingers of the set 18 into closer proximity of the chip 10. Preferably each finger of the set of fingers 16 terminates at a distance less than 100 mils from the edge of the chip to which they will be attached as will be described presently.

The ends of the fingers of the set of fingers 18 are spaced at a greater distance from the chip than the fingers 16, normally this will be a distance greater than 100 mils, and which can be as great as 200 mils. As indicated above, if the spacing of the fingers from the chip connection is 100 mils or less a single loop of wire normally will be satisfactory in that it will not be subject to significant "wire wash" or "wire sweep" when encapsulation takes place. However, with fingers spaced more than 100 mils, e.g. at a distance of 200 mils, a single loop or stretch of unsupported wire will be subject to wire sweep or wire wash. Also, the increased length of wire will add significantly to the inductance of the structure. Moreover, with the thickness and width and spacing of fingers which are normally required for semiconductor chip packaging it can be seen that it would not be possible to bring all of the fingers 16 and 18 into close proximity of the chip (i.e. within 100 mils) because of physical limitations. However, by interdigitating the fingers and allowing half of them to terminate at a distance of 200 mils from the chip, the other half of the interdigitated fingers can be brought into closer proximity while still maintaining the necessary width of the fingers and the spacing for proper electrical characteristics. Further, this configuration is desirable, irrespective of distance if crossover configurations of the wires to the fingers is desired as will be described presently.

In order to form the connections, a first set of wires 20a, 20b, ... 20n is connected directly between pads 14a, 14b, ... 14n and the first set of fingers 16a, 16b, ... 16n. A second set of wires 22a, 22b, ... 22n connected between the pads 14a, 14b, ... 14n and the second set of fingers 18a, 18b, 18n; but this connection is accomplished by means of a pier or bridge 24. The pier or bridge 24, in the preferred embodiment, is a continuous ring formed of a dielectric material such as a polyimide or an epoxy which is bonded to the first set of fingers 16 and spaced from their ends. The pier 24 has a series of spaced metallized pads 26a, 26b, ... 26n preferably formed of copper or the like, and the second set of wires 22a, 22b, ... 22n is stitch-bonded metallurgically to the metal pads 26a, 26b, ... 26n so as to provide firm support and thus provide two loops 27a, 27b, ... 27n, and 28a, 28b ... 28n in the second set of wires 22a, 22b, ... 22n. Each loop 27, 28 preferably is less than 200 mils long. If for some reason a metallurgical bond is not desired or required, a non-conducting adhesive can be used to bond the second set of wire intermediate their ends. In such a case, the bonding areas need not be discrete, but can be a continuous adhesive ring if desired.

By virtue of the intermediate bonding, the long unsupported 200 mil length loop which is subject to wire sweep is overcome. Further, rather than terminating all of the fingers at the location of the second fingers, half of them can be brought in much closer to the chip, and thus reduce the length of at least half of the wire connections thereby reducing the impedance.

Figure 2:
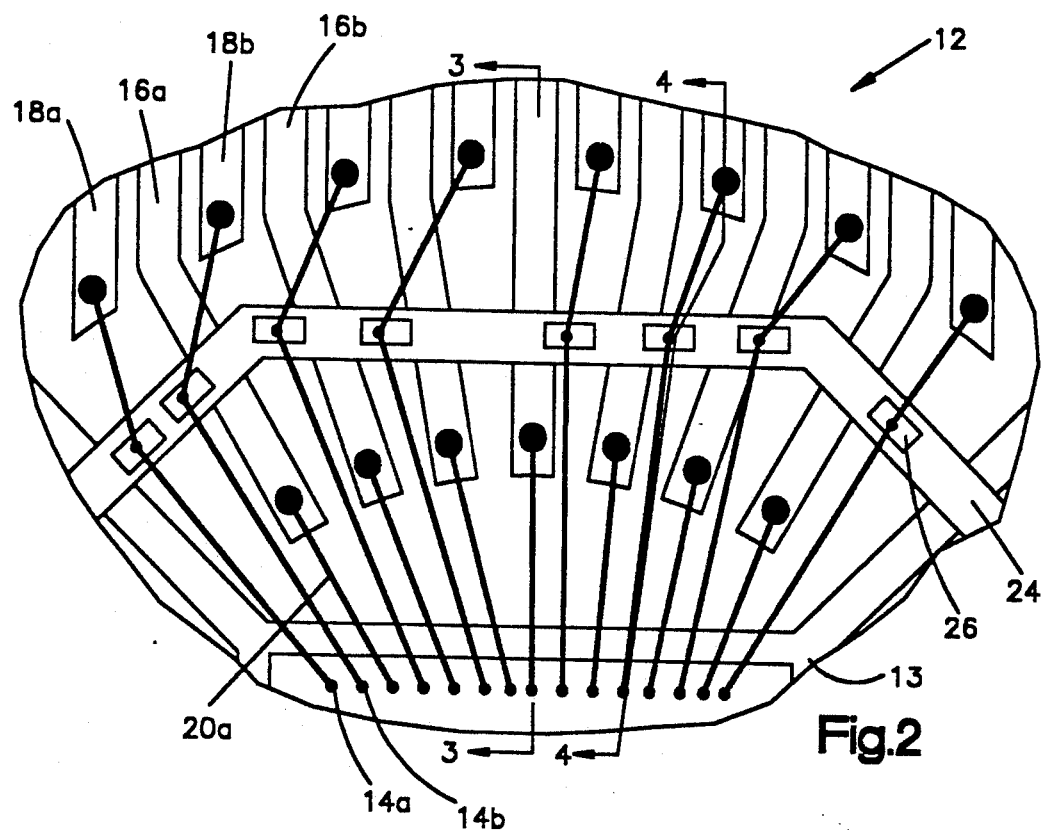
FIG. 2 is a fragmentary top plan view, on an enlarged scale from FIG. 1, of a portion of a lead frame and chip mounted thereon showing the wire interconnections between chip pads and fingers.
Figure 3:
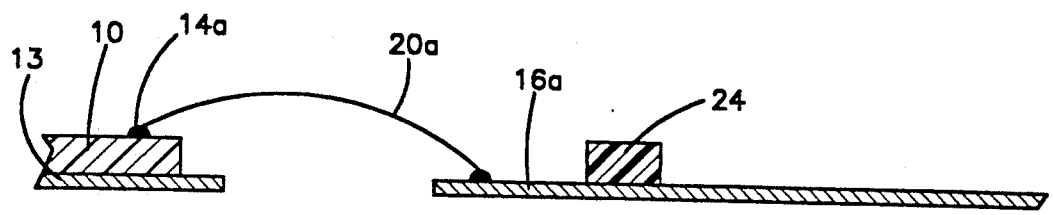
FIG. 3 is a sectional view taken substantially along the plane designated by line 3—3 of FIG. 2.
Figure 4:
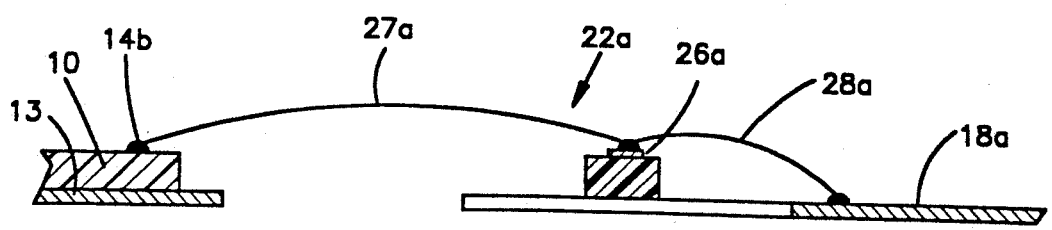
FIG. 4 is a sectional view taken substantially along the plane designated by the line 4—4 of FIG. 2.

A further benefit in using the pier with the wires bonded thereto is shown on the left hand side of FIG. 2 wherein it can be seen that cross-over connections between pads 14 on the chip and fingers 18 and 20 can be formed. Thus it is not necessary for each finger to be bonded to the pad aligned therewith but the versatility of allowing cross-overs is provided.

The pier or bridge 24 preferably is formed of a polyimide epoxy material although other dielectric materials could be used, and is formed as a unitary structure. The metal pads 26 preferably are copper or some similar metal and the preferred wires used for bonding are gold wires. The pads 26 of course must be discreet pads so that the wires 22a, 22b, . . . 22n are insulated from each other. However if different materials are selected for wires, then different materials can be selected for the pads. The significant requirements of the pads and wires is that the pads and wires be selected to b bondable to each other and which bond will maintain a strong physical bond when subsequent molding takes place. Of course, the pads 26 must be firmly adhered to the pier such that they do not pull out during molding. There are a variety of polyimide or other dielectric films which will meet this criteria which can be metallized by sputtering, plating or rolling techniques and personalized by means of subtractive etching. These films can be attached by adhesive directly, or raised on a molded pier to regulate spacing of adjacent wires. Utilizing thermal setting resins for the pier or adhesives eliminates the need for metal personalization, all as is well known in the art. Further it is to be understood that it is possible that the wires of the second set of 22a, 22b, . . . 22n rather than being formed as a single wire with a stitch bond intermediate their ends could be formed as two separate wires, one wire bridging from the chip connection pad 14 to the metal pad 26 and the other wire bridging from the metal pad 26 to the respective finger 18.

Also as indicated above the bond pier 24 is preferably formed as a single ring element, in either an oval or a polygonal shape, with discreet bond pads formed thereon, with the pier 24 being formed of a plastic such as a polyimide or an epoxy. The polyimide or epoxy can readily be bonded with known adhesives to the tops of the fingers 18 and in such case this provides additional support structure. Moreover, such construction also tends to maintain the fingers 18 in desired planer pattern. It is contemplated, however, that the pier 24 can be formed as a plurality of discreet insulating members bonded to individual fingers or groups of fingers 18. Other configurations will be apparent to those skilled in the art.

It should also be noted that in the preferred configuration the width of both the fingers 16 and 18 is essentially the same. Hence, by providing two different lengths, the spacing between the fingers can be maintained so that they are no closer than any two adjacent fingers at the 200 mil distance even though half of them come to the 100 mil distance. This is accomplished by the specific geometry which allows the fingers 16 to converge on each other as they extend past the ends of fingers 18 toward the chip.

Further, it will be noted that the distance of the ends of the fingers 16 is not uniform from the chip although they could be so made if desired. However because of the converging geometry, the fingers are terminated when they reach the minimum required spacing between conductors or in the closest allowable proximity to the chip bond portion 13 to thereby allow the shortest possible distance of a run for each of the wire connections which are made to the fingers 16 from the respective pads 14.

When all of the pads 14 have been connected to their respective fingers 16 or 18, the chip and connected fingers which form the lead frame are then encapsulated in a plastic such as a epoxy by conventional means. Various types of conventional molding machines can be utilized for encapsulation. For example various models (e.g. 140, 280, 480, and brilliant 100) of molding machines manufactured by FICO Corp. of the Netherlands may be used, and employing the proper molds to provide the desired finished product. ASM Electronic materials Handbook, Vol. 1, published in 1989 at pages 472 and 473 describes transfer molding techniques that can be utilized to practice this invention. Because of the short wire runs as described above, "wire wash" or "wire sweep" by the molding plastic is not a significant problem.

While a preferred embodiment of this invention has been shown and described, various adaptations and modifications can be made without departing from the scope of the invention as defined in the appended claims.

Having thus described the preferred embodiment, the invention is now claimed to be:

1. A semiconductor chip package comprising:
   a semiconductor chip having a plurality of input and output pads thereon,
   a lead frame configuration having a first set and a second set of interdigitated extended fingers, the fingers of each set having inner ends surrounding said chip,
   said first set of said fingers having the inner ends thereof terminating at a first distance from said chip,
   the second set of said fingers having the inner ends thereof terminating at a second distance from said chip, said second distance being greater than said first distance,
   intermediate bonding regions positioned over and insulated from said first set of fingers and located between the inner ends of the second set of fingers and the inner ends said first set of fingers,
   a first set of wire means directly coupling respective pads on said chip to the fingers of said first set of fingers,
   a second set of wire means coupling respective pads on said chip with said second fingers, each wire of said second set of wire means having a first portion extending from its respective pad to a bonding region and bonded thereto, and a second portion extending from said bonding region to one of the fingers of said second set of fingers; and
   plastic encapsulation means enveloping said chip, and said inner ends of said fingers and said wire means.

2. The structure as defined in claim 1 wherein said intermediate bonding regions are comprised of a dielectric material mounted on said first set of fingers and having bonding regions located thereon.

3. The structure is defined in claim 2 wherein said bonding regions include discrete metal pads each bonded to said dielectric material one for each of said second set of wires.

4. The structure as defined in claim 1 wherein the wire means connected to said second set of fingers are each comprised of a unitary wire bonded intermediate its opposite ends to said bonding regions.

5. The structure as defined in claim 2 wherein said bonding regions are comprised of a unitary ring of insulating material secured to said first set of fingers and having discreet metal bonding pads formed thereon with each bonding pad bonded to one of said second set of wires.

6. The structure as defined in claim 1 wherein fingers of said first set of fingers converge upon each other in their regions between the ends of the second set of fingers and said chip.

7. The device as defined in claim 6 wherein the width of the fingers of said first set and the width of the fingers of said second set are substantially equal, and the spacing between the fingers of said first set of fingers at all locations thereof is equal to or greater than the spacing between the fingers of said first set and the fingers of said second set at the interdigitated locations.

8. The device as defined in claim 1 wherein said interdigitated fingers are essentially coplanar.

9. The device as defined in claim 1 wherein the wire means are metallurgically bonded to the intermediate bonding regions.

* * * * *